United States Patent Office
3,079,282
Patented Feb. 26, 1963

3,079,282

PRINTED CIRCUIT ON A CERAMIC BASE AND METHOD OF MAKING SAME

Martin N. Haller and Charles J. Owen, Pittsburgh, Pa., assignors to the United States of America as represented by the Secretary of the Air Force No Drawing. Filed May 24, 1960, Ser. No. 31,499
2 Claims. (Cl. 117—212)

This invention relates to an improvement in printed circuits and, more particularly, to a means and method for bonding conductive material to a refractory base which may be subjected, in use, to high environmental temperature such as 900° to 1300° C. It consists essentially of a mixture of silver and platinum powders which, when screen printed and fired in air at a temperature above the melting point of silver, will adhere strongly to a dielectric substrate and provide a conductive, essentially two-dimensional electrode pattern for interconnecting electronic components.

It is an object of our invention to provide a composition for the screen-printing of essentially two-dimensional conducting patterns that will facilitate the interconnection of printed resistors, capacitors, inductors, and the like, and that will withstand temperatures of the order of 1300° C. without affecting the geometric configuration of said patterns or rendering same nonconductive.

It is an additional object of our invention to provide a composition for the screen-printing of conducting patterns that will adhere strongly to a dielectric substrate material such as alumina without the utilization of a glaze component in said composition to provide a bond to the substrate.

It is also an object of our invention to provide a composition for the screen-printing on a dielectric substrate of conducting patterns that may be subsequently fired in air rather than a controlled atmosphere and which may be thereupon operated in air at elevated temperatures.

Another object of our invention is to provide a composition range of mixtures of metal powders without the addition of a "wetting agent."

While a number of metallizing techniques, such as spray-coating, vacuum metallizing by evaporation, chemical or electroless plating, and screen-printing coupled with kiln firing may be adapted to the production of printed circuitry, the utilization of these various techniques in the production of high temperature printed circuitry may be reduced to a selection of the one technique that may best be adapted under the specific restrictions involved.

If highly restrictive cross-sections must be produced, as for micro-circuitry where all three-dimensions are miniaturized, vacuum evaporation techniques would far excell any other single method in so far as reproducibility and dimensional accuracy are concerned.

In the production of essentially two-dimensional printed circuitry, i.e., circuits and components having length and width but comparatively little thickness (less than one mil), the selection of a production technique becomes more dependent upon the interrelated physical and electrical properties of the constituent materials.

The screen-printing of conducting connecting circuits on a ceramic substrate followed by kiln firing offers a number of advantages in the production of temperature-resistant, two dimensional circuitry. These advantages may be summarized by a statement to the effect that the method lends itself well to the economical mass production of such components in that satisfactory reproducibility can be obtained. A liberal estimate of dimensional reproducibility by this method would be of the order of plus or minus 5 to 10%. A similar rough estimate for physical property reproducibility would approximate plus or minus 20% and would vary with the specific physical property in question. The foregoing reproducibility estimates are a function of the specific equipment utilized in following the teachings of the method. Thus, an almost completely automated technique would be expected to be more reproducible than is indicated above and the resulting production would more closely follow the mathematician's normal distribution curve.

A number of inherent physical properties related to the structure of these screen-printed and fired enamel systems are difficult to obtain in situ. For example, it has been demonstrated that adhesion of a printed circuit or component to a ceramic substrate may be obtained by including a powdered glass or glaze of appropriate firing temperature in the enamel composition. However, the beneficial adhesion obtained may be offset by micro-cracking of the fired circuitry and subsequent failure of same during testing.

In addition, the fired circuitry may be operably limited temperature-wise. Laboratory investigations have shown, for example, that a glaze-containing circuit or component is, as a general rule, acceptably operable up to a temperature of within about 300 to 400° C. of the firing temperature of the glaze constituent. Beyond this limitation the circuit or component generally behaves erratically and initial operating characteristics are permanently affected.

The optimum screen-printed connecting circuit would, thus, eliminate the glaze component as a constituent in the printing mixture. However, adhesion of the noble metals to an oxide substrate such as polycrystalline alumina or forsterite has not previously been demonstrated as being sufficiently feasible to allow the bonding of an essentially two-dimensional connecting circuit to such a substrate. Noble metals have been generally considered to be non-wetting on alumina, that is, the contact angle of a sessile drop of metal on alumina has approximated 90°, or a greater value, and has therefore been considered non-adherent.

Extensive laboratory investigations by the inventors have shown that this is not necessarily true. The firing in air of a droplet of silver on alumina at a temperature above the melting ponit of silver has been found to produce a strongly adherent bond even when the contact angle approximates 90° or some greater value, contrary to current theory. The same effect was noted for gold. It followed, therefore, that alloys of these two metals might also be adherent. Further investigation along these lines, however, showed that this hypothesis did not follow with certainty. Only silver-platinum alloys of specific compositions, fired in air within certain temperature limitations, would give a strongly adherent, conducting, essentially two-dimensional connecting circuit on polycrystalline alumina and forsterite substrates. Other alloy mixtures of Ag—Pd, Au—Pt, and Au—Pd have been found to be not sufficiently adherent so as to be useful as fired connecting-circuit alloys.

When initial exploratory tests showed that Ag—Pt alloys would adhere to an alumina or forsterite substrate, it was thought that the binary phase diagram would prove an excellent guide in formulating compositions and specifying firing temperatures. However, subsequent testing for strength of adhesion and conductivity of various Ag—Pt compositions over the full range of Ag content showed that the phase diagram provides no more than a hint of the probabilities involved.

The composition limitations and associated air-firing temperatures shown herewith were obtained through a study of the entire Ag—Pt alloy system. Tensile measurements were made by pulling, at room temperature, a connecting wire that was bonded to the substrate with a quantity of the powdered Ag and Pt plus oily vehicle mixture as a joining composition over a circular area of 0.35-inch diameter on the substrate. The connection was then bonded to the substrate material by firing at a temperature varying from 1000 to 1500° C. Bulk tensile strengths referred to may be considered as being a function of the joint cross-sectional area and the stress applied thereto. Tensile measurements were made by: pulling to failure a 24-gauge copper wire soldered to the printed and fired (on the substrate) electrode film; closely approximating the area of failure at the film-substrate interface; and, calculating the ultimate tensile strength of the alloy film-substrate interface as a function of these. The film tensile values obtained were also room temperature test values.

Conductivity comparisons were made by utilizing the four-point probe method on the printed and fired connecting film and are considered qualitative only but sufficient for the purpose of selections. By assuming the conductivity reading obtained from a one-mil thickness of platinum foil (of the same general configuration as the printed conducting lines) as a standard, all four-point probe readings for the various alloy compositions have been compared with this. The variation in conductivities, when compared as previously described, ranged from about 7.5 to 85% of the conductivity of platinum foil.

For both bulk alloy connections and printed alloy films, it was found that the combinations of low silver content alloys and high firing temperature and high silver content alloys and low firing temperatures provided improved tensile strength, conductivity, and freedom from distortion.

It is believed that silver in the alloy performs the dual function of providing a bond to the substrate and forming an alloy with the platinum.

Once alloying of the metal powders is achieved and the circuit configuration is cooled to room temperature, the alloyed pattern obtained can be operated as a conducting circuit at temperatures approaching the melting point of that specific alloy or the firing temperature, whichever is the lower. The Ag—Pt binary phase diagram is helpful in this respect. Thus, the circuit operating temperature may vary with silver content from 900° C. to 1300° C.

Our invention utilizes a mechanical mixture of very fine platinum and silver powders with an included proprietary oily vehicle of a type similar to pine oil or squeegee oil.

The metal powders should be of a particle size small enough to pass through a 325 mesh screen or less than 44 microns maximum particle diameter. The proprietary oily vehicle, such as pine oil or squeegee oil, must be of such purity that it is virtually totally volatilized at a temperature less than the melting temperature of the silver powder constituent. The metal powders and the oily vehicle are mechanically mixed to a pasty, homogeneous consistency and the resulting mixture is ready for screen-printing. This mixture is then used for the screen-printing of connecting circuits in the specific configuration described by the screen design on a ceramic substrate such as 96% alumina or forsterite. All of the foregoing materials are commercially available. The substrate with the circuit configuration printed thereon is then fired in air in a kiln to a maximum temperature of between 1000 and 1500° C. with a heating and cooling rate approximating 7.5 to 12.5° C. per minute.

An example of a lower-firing temperature mixture for the screen-printing of a Ag—Pt connecting circuit on either alumina or forsterite is:

90% by wt. Ag powder
10% by wt. Pt powder
Plus 1 part of oil by weight to each 3 parts of total metal powder by weight.

The foregoing constituents are mechanically mixed to a pasty constituency and used in screen printing the connecting circuit design on the substrate. The printed sample is then dried on a hot plate at about 100° C. to drive off the greater volume of the oily vehicle and then fired in a kiln at 1000° C. The heating and cooling rate may be approximately 7.5 to 12.5° C. per minute.

An example of a higher-firing temperature mixture for the screen-printing of a Ag—Pt connecting circuit on either alumina or forsterite is:

5% by wt. Ag powder
95% by wt. Pt powder
Plus 1 part by weight of oil to each 8 parts by weight of total metal powder.

The foregoing constituents are mechanically mixed to a pasty constituency and used in screen-printing the connecting circuit design on the substrate. The printed sample is then dried on a hot plate at about 100° C. and subsequently fired in a kiln at 1500° C. for alumina substrates or 1400° C. for forsterite substrates, the heating and cooling rates approximating 7.5 to 12.5° C. per minute.

The above examples also serve to illustrate the fact that the proportion of oil added to the metal powder mixture varies directly with the proportion of silver powder used. The variation over the full range of silver content is as shown, from 1 part oil per 8 parts total metal powder to 1 part oil per 3 parts metal powder. The larger bulk density of silver powder dictates the amount of oil needed for obtaining the proper viscosity necessary for screen-printing.

The foregoing examples of mixtures of metals and oil for use in screen-printing the thin electrode configurations may also be used as bulk alloy mixtures for external connections. In essence, only the technique of application and end product geometry vary. Connections of this type may be accomplished by placing a globule of the pasty bonding mixture on the appropriate electrode area, submerging the lower coil or two of a cylindrically-coiled connecting wire (in this case platinum wire) into the globule, and firing the whole at the appropriate firing temperature.

For those applications where both bulk alloy connections and screen-printed electrode films constitute the electrode system, the metal powder concentration limits are listed below in Table I for two substrates and six firing temperatures.

*Table I*

CONCENTRATION LIMITS FOR COMBINATION OF Ag—Pt BULK ALLOY CONNECTIONS WITH PRINTED Ag—Pt ELECTRODE CIRCUITS

| Firing Temp., ° C.[1] | Metal Powder Concentration Limits for Alloyed Circuitry On— | |
|---|---|---|
| | 96% Alumina Substrate[2] | Forsterite Substrate[3] |
| 1,000 | 47 to 90 % Ag, balance Pt | 47 to 90 % Ag, balance Pt. |
| 1,100 | 47 to 53 % and 67 to 73% Ag, balance Pt. | 27 to 53% and 67 to 73% Ag, balance Pt. |
| 1,200 | 47 to 53% Ag, balance Pt | 3 to 23% Ag, balance Pt. |
| 1,300 | 3 to 7% Ag, balance Pt | Do. |
| 1,400 | do | Do. |
| 1,500 | do | Substrate Deforms. |

NOTE.—All percentages above are percentages by weight.

[1] Allowable temperature variance is ±50° C.; firing temperature must also be at least 20° C. above the melting point of silver.
[2] Available commercially as Al Si Mag No. 614.
[3] Available commercially as Al Si Mag No. 243.

Metal power concentration limits are listed below in Table II for two substrates and six firing temperatures.

*Table II*

CONCENTRATION LIMITS FOR SCREEN-PRINTED Ag—Pt ELECTRODE CIRCUITS

| Firing Temp., ° C.[1] | Metal Powder Concentration Limits for Alloyed Circuitry On— | |
|---|---|---|
| | 96% Alumina Substrate [2] | Forsterite Substrate [3] |
| 1,000 | 3 to 7%, 27 to 33% and 47 to 90% Ag, balance Pt. | 3 to 90% Ag, balance Pt. |
| 1,100 | 3 to 12%, and 27 to 73% Ag, balance Pt. | 3 to 73% Ag, balance Pt. |
| 1,200 | 3 to 12%, 27 to 33%, and 47 to 53% Ag, balance Pt. | 3 to 33% Ag, balance Pt. |
| 1,300 | 3 to 33% Ag, balance Pt. | 3 to 23% Ag, balance Pt. |
| 1,400 | 3 to 23% Ag, balance Pt. | Do. |
| 1,500 | do. | Substrate Deforms. |

NOTE.—All percentages above are percentages by weight.

[1] Allowable temperature variance is ±50° C.; firing temperature must also be at least 20° C. above the melting point of silver.
[2] Available commercially as Al Si Mag No. 614.
[3] Available commercially as Al Si Mag No. 243.

The foregoing metal powder combinations as described in Tables I and II must be mixed with a volatile oil such as pine oil or squeegee oil for the purpose of obtaining a viscous mixture that can be satisfactorily screen-printed. The oil also serves to maintain the printed circuitry geometry through the initial firing stage. The relative amounts of oil needed to prepare an acceptable screen-printing mixture vary directly with the silver powder content of the specific alloy to be used in accordance with the following:

| Ag Powder Content, Percent by wt. | Oil to Powder Ratio, Parts by wt. |
|---|---|
| 90 | 1 part oil to 3 parts pdr. |
| 80 | 1 part oil to 4 parts pdr. |
| 70 | Do. |
| 60 | 1 part oil to 5 parts pdr. |
| 50 | Do. |
| 40 | 1 part oil to 6 parts pdr. |
| 30 | Do. |
| 20 | 1 part oil to 7 parts pdr. |
| 10 | Do. |
| 5 | 1 part oil to 8 parts pdr. |

We do not wish to be limited, with regard to substrate composition, to exactly 96% alumina as a substrate material. Variation in substrate composition, i.e., 96 to 99% $Al_2O_3$, has been found to affect only the physical properties of the substrate and to have little or no effect on the conductivity or bond strength of the Ag—Pt alloy circuits or connections.

Although the invention has been described with reference to a particular embodiment, it will be understood to those skilled in the art that the invention is capable of a variety of alternative embodiments. For example, if the undesirable effects of increased resistivity of the resultant product may be tolerated when a wetting agent such as cuprous oxide is added, this substance may be included for increased bonding strength. We intend to be limited only by the spirit and scope of the appended claims.

We claim:

1. A method for applying an electrically conductive printed circuit to a ceramic base wherein said ceramic base is selected from the group consisting of alumina and forsterite consisting essentially of the steps of forming a paste by mixing a metal powder with an amount of volatile oil sufficient to form said paste, said metal powder consisting of a mixture of about 5 percent by weight to 90 percent by weight of finely divided silver and the balance substantially all finely divided platinum, applying said paste to said ceramic base in a predetermined pattern, dryng said paste by heating the same to a temperature of about 100° C. in order to volatilize said oil, firing said ceramic base in air at a temperature of from about 1000° C. to 1500° C. in order to bond said paste to said ceramic base, and subsequently cooling said bonded ceramic base to room temperature.

2. A printed circuit particularly adapted for use at elevated temperatures in the range of 900 to 1300° C. consisting essentially of a ceramic base selected from the group consisting of alumina and forsterite, an electrically conductive pattern having a predetermined shape firmly bonded to said ceramic base, said pattern comprising an in situ fused, alloy of silver and platinum, said alloy having a proportion of 5 percent by weight to 90 percent by weight of silver with the balance substantially all platinum.

References Cited in the file of this patent

UNITED STATES PATENTS

| | | |
|---|---|---|
| 2,280,135 | Ward | Apr. 21, 1942 |
| 2,757,104 | Howes | July 31, 1956 |
| 2,820,727 | Grattidge | Jan. 21, 1958 |

OTHER REFERENCES

New Advances in Printed Circuits, National Bureau of Standards Publication 192, November 22, 1948, pp. 15, 16, 17.